United States Patent
Ladin et al.

(10) Patent No.: US 7,409,662 B1
(45) Date of Patent: Aug. 5, 2008

(54) SYSTEMS AND METHODS INVOLVING DESIGNING SHIELDING PROFILES FOR INTEGRATED CIRCUITS

(75) Inventors: Karl L. Ladin, Rochester, MN (US); Erik S. Unterborn, Pine Island, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/033,668

(22) Filed: Feb. 19, 2008

(51) Int. Cl.
G06F 17/50 (2006.01)

(52) U.S. Cl. .................. 716/11; 716/8; 716/12; 716/15

(58) Field of Classification Search .......... 716/1, 716/2, 4, 12, 13, 14, 15, 8, 11
See application file for complete search history.

(56) References Cited

U.S. PATENT DOCUMENTS

2004/0025132 A1  2/2004  Valine

*Primary Examiner*—Stacy A Whitmore
(74) *Attorney, Agent, or Firm*—Cantor Colburn LLP

(57) ABSTRACT

A method for designing shielding in integrated circuits, the method comprising, receiving a first input designating a first net segment profile on a first level in an integrated circuit for shielding, determining whether the designated first net segment profile is in electrical communication with other net segment profiles, determining whether the net segment profiles are located in a different level than the first net segment profile, defining a first shielding profile corresponding to the net segment profiles on the first level, defining a second shielding profile corresponding to the net segment profiles on the second level, determining and removing segments of the first shielding profile and the second shielding profile contact features of the integrated circuit, determining and removing segments of the first shielding profile and the second shielding profile are non-continuous, defining vias at the intersections of first shielding profile and the second shielding profile.

3 Claims, 11 Drawing Sheets

SYSTEMS AND METHODS INVOLVING DESIGNING SHIELDING PROFILES FOR INTEGRATED CIRCUITS

BACKGROUND OF THE INVENTION

1. Field of the Invention

This invention relates generally to systems and methods for designing integrated circuits and, more particularly, to a system and method for providing interactive shield wire generation in a chip layout design tool.

2. Description of Background

When designing integrated circuits (IC's), it may be desirable to add shielding lines around certain net segments to reduce noise in the net segments. Adding shielding to specific lines may be time consuming in large circuits. Therefore, it is desirable that a system for designing IC's allows a user to designate specific line segments that should be shielded. The system then adds the shielding lines to the circuit design responsive to the designation of the user.

SUMMARY OF THE INVENTION

The shortcomings of the prior art are overcome and additional advantages are achieved through an exemplary method for designing shielding in integrated circuits, the method comprising, receiving a first input designating a first net segment profile on a first level in an integrated circuit for shielding, determining whether the designated first net segment profile is in electrical communication with other net segment profiles, determining whether the designated net segment profiles determined to be in electrical communication with the first net segment profile for shielding are located in a different level than the first net segment profile, designating net segment profiles determined to be in electrical communication with the first net segment profile for shielding, defining a first shielding profile corresponding to the designated net segment profiles on the first level, defining a second shielding profile corresponding to the designated net segment profiles on the second level, determining which segments of the first shielding profile and the second shielding profile contact features of the integrated circuit, removing segments of the first shielding profile and the second shielding profile determined to contact features in the integrated circuit, determining which segments of the first shielding profile and the second shielding profile are non-continuous, removing segments of the first shielding profile and the second shielding profile determined to be non-continuous, defining vias at the intersections of first shielding profile and the second shielding profile, wherein the vias are operative to connect the first shielding profile on the first level to the second shielding profile on the second level, and outputting the first shielding profile, the second shielding profile, and the vias to a display.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Systems and methods involving designing integrated circuits are provided. In this regard, integrated circuits (IC's) are often designed using a computer system including a processor and software. Often during the design process, it is determined that shielding is needed in certain portions of the IC to reduce noise. Typically, a designer returns to a plan for the IC developed on a computer and inserts the shielding lines around the components that will use shielding. The design process of shielding uses a number of steps that take time and effort from the designer. It is desirable for a method and system to substantially automate the steps for adding shielding in an IC design.

Figure 10:
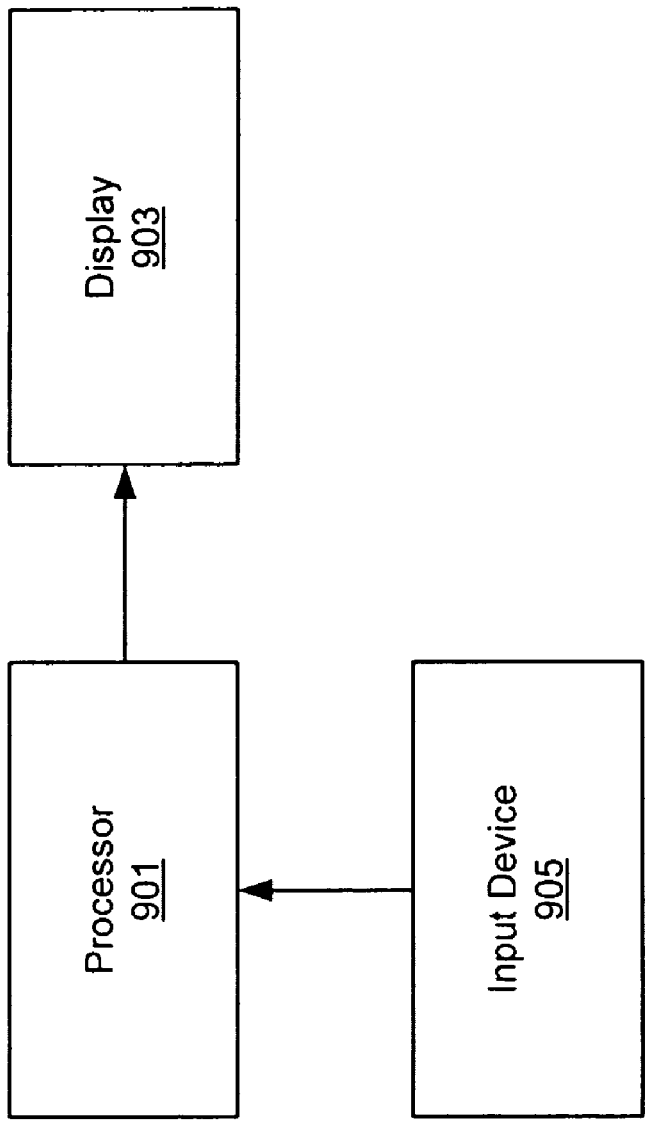
FIG. 10 illustrates an exemplary embodiment of a system for designing shielding in IC circuits.

FIG. 10 illustrates an exemplary embodiment of a system for designing shielding in IC's. The system of FIG. 10 includes a processor 901 communicatively linked to a display 903 and an input device 905. In operation, the processor 901 is operative to execute an exemplary method illustrated in FIGS. 1a and 1b.

Figure 1A:
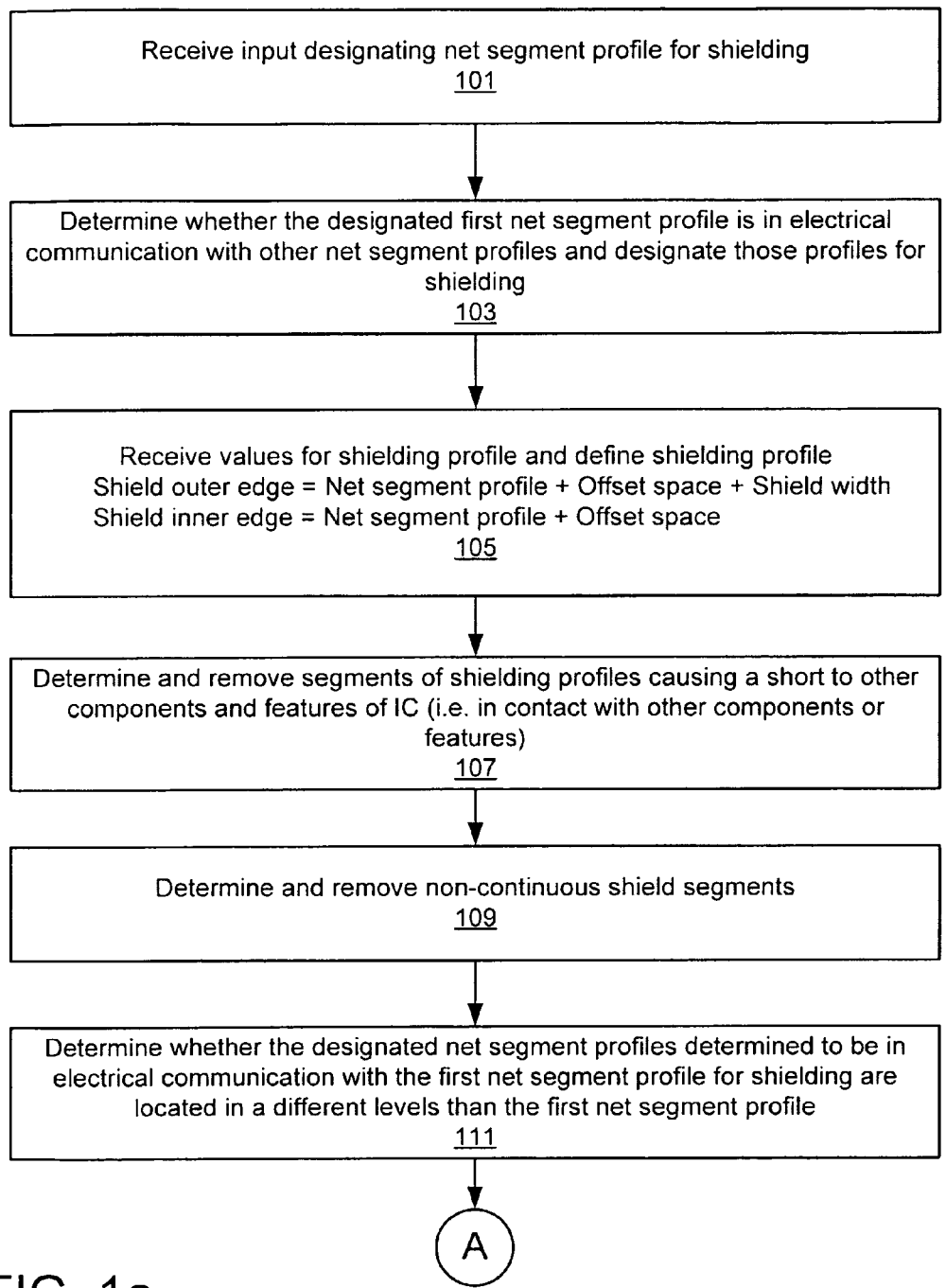
FIGS. 1a-1b illustrate an exemplary method for designing shielding in IC circuits.
Figure 1B:
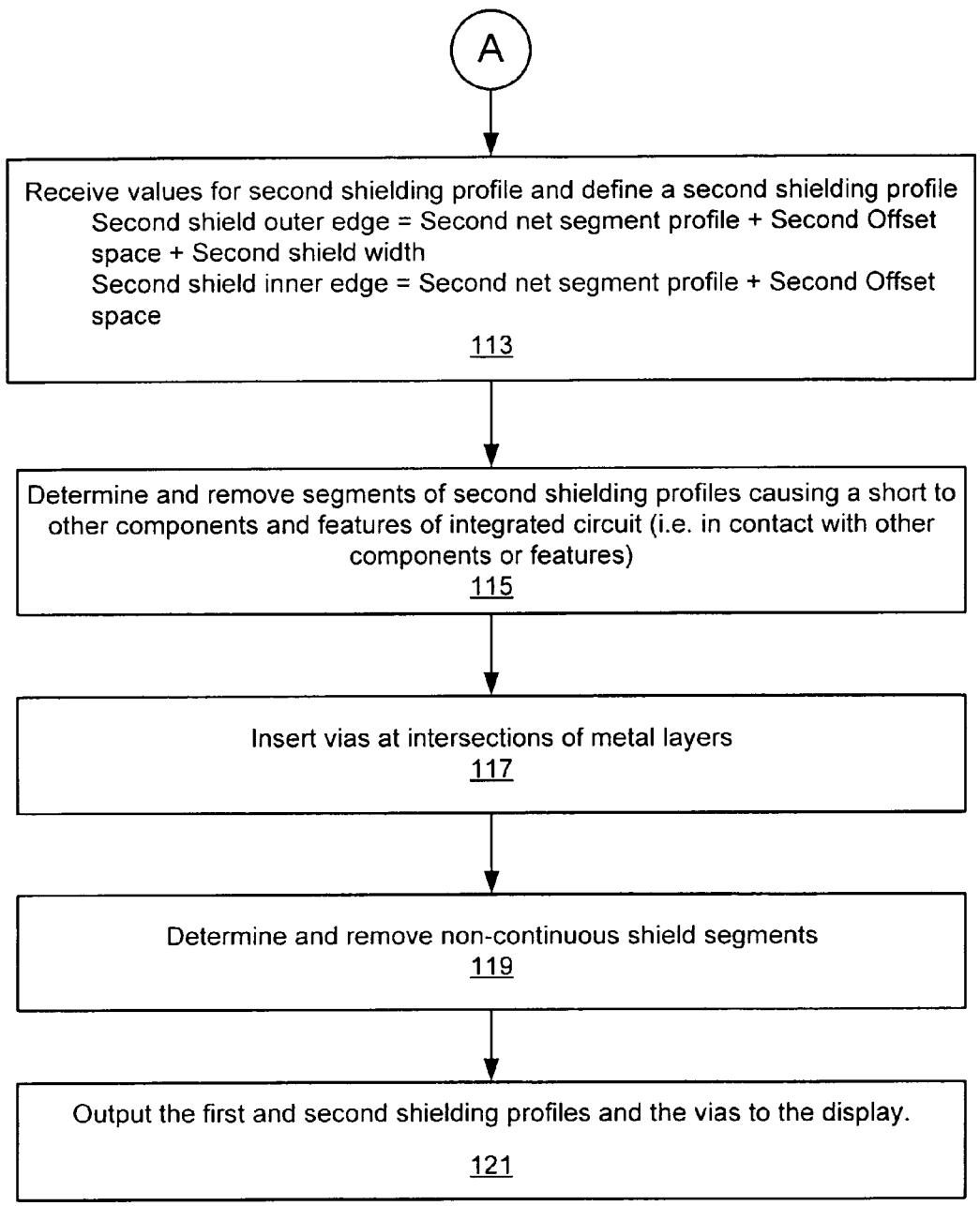
Figure 2:
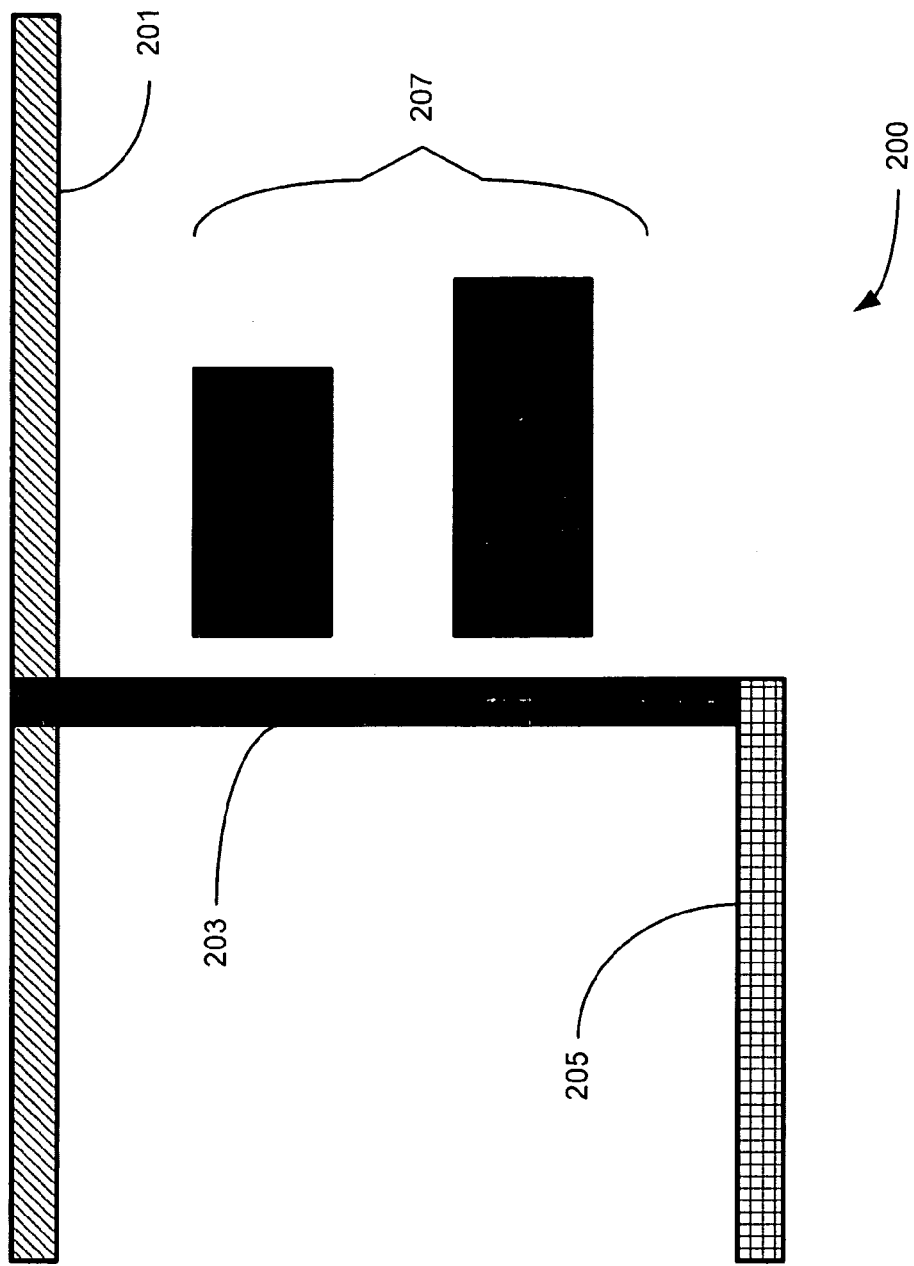
FIGS. 2-9 illustrate an example of the steps of the method illustrated in FIGS. 1a-1b applied to an IC design.

The method illustrated in FIGS. 1a and 1b is further illustrated in FIGS. 2-8. FIG. 2 illustrates a top view of an example of a portion of an IC 200. IC 200 includes a first segment profile 201, a second segment profile 203, a third segment profile 205, and IC features 207. The IC features 207 may include, for example, components in the IC and other features such as, lines and contact points. In the illustrated example, the segment profiles are located on different vertical levels in the IC and are connected with vias (not shown).

Referring to FIG. 1a, the method begins in block 101, where the processor 901 (of FIG. 10) receives an input from a user designating a net segment for shielding. A user may make the designation by, for example, selecting a particular segment such as the first segment profile 201 (from FIG. 2) with the input device 905. In block 103, once the processor 901 has received the designated net segment for shielding, the processor 901 determines what other net segments are in electrical communication with the designated net segment. In IC 200, since the first segment profile 201 is connected to the second and third segment profiles 203 and 205, the processor 901 designates the second and third segment profiles 203 and 205 for shielding.

The processor 901 receives values that to define the shielding profile for the segment profiles on the same vertical layer level in the IC as the first segment profile 201 in block 105. The values that define the shielding profile are: Net segment profile, Offset space, and Shield width. The dimensions of the shielding profile are defined by the equations:

Shield outer edge=Net segment profile+Offset space+ Shield width

Shield inner edge=Net segment profile+Offset space

Once the processor 901 receives the values to the shielding profile and determines the shield outer edge and the shield inner edge, the processor 901 defines the shielding profile.

Figure 3:
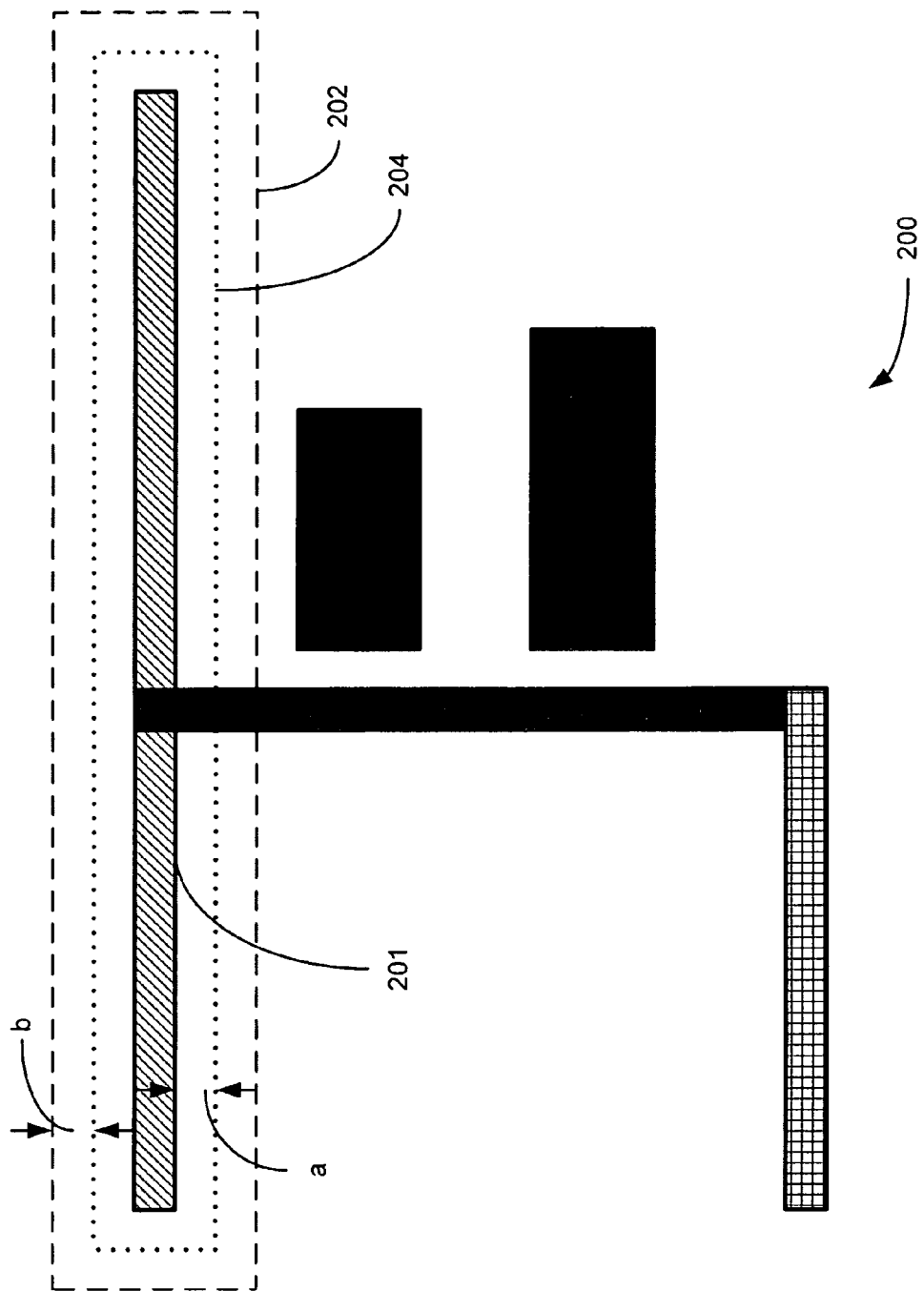

FIG. 3 illustrates the shield outer edge 202 and the shield inner edge 204 of the first segment profile 201. The net segment profile is the first segment profile 201 while the offset space (a) is the distance between the shield inner edge 204 and the first segment profile 201. The shield width (b) is the distance between the shield outer edge 202 and the shield inner edge 204.

Figure 4:
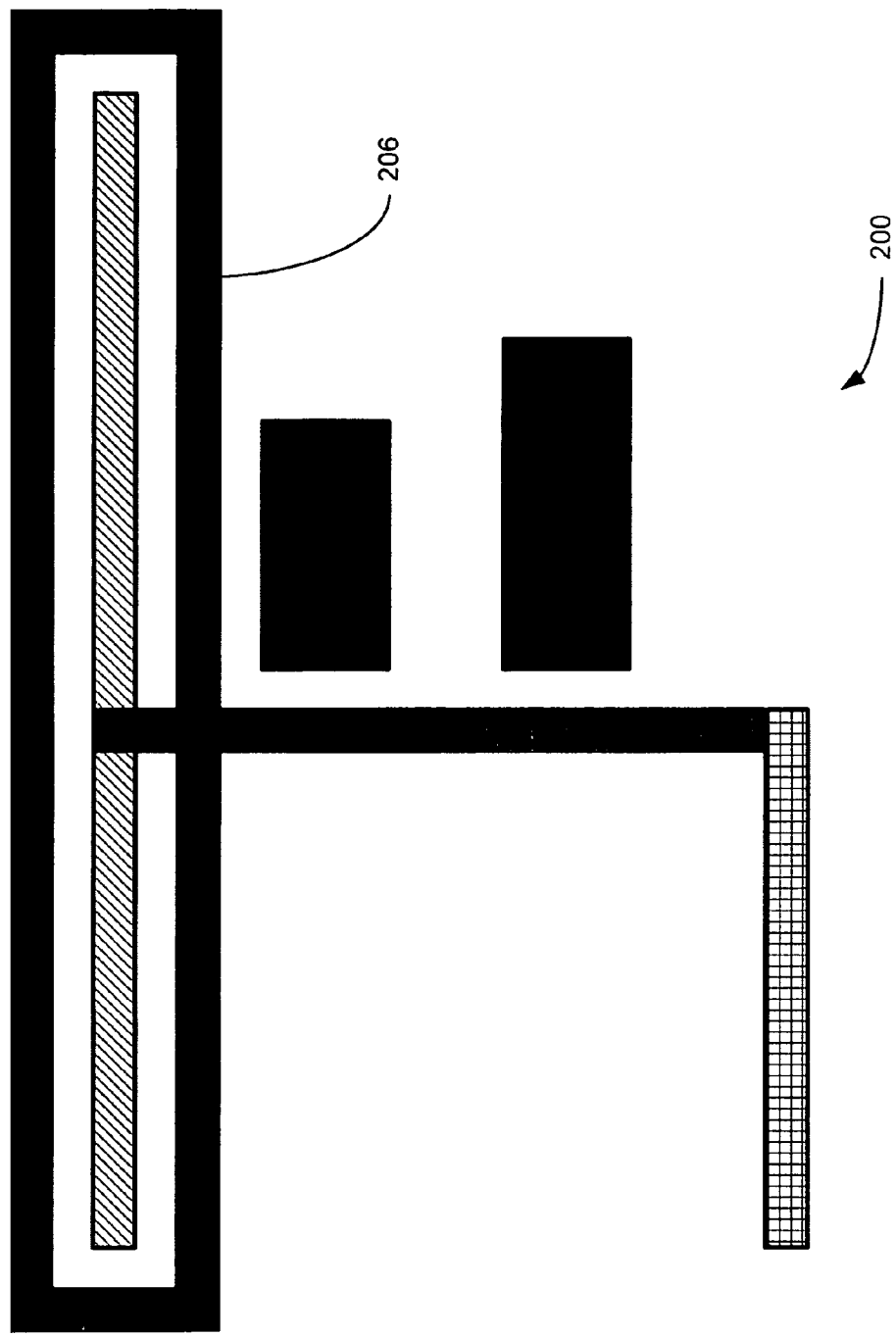

FIG. 4 illustrates a first shield 206 defined by the shield outer edge 202 and the shield inner edge 204. In block 107, the processor 901 removes segments of the shielding profiles causing a short to other components and features of IC (i.e. in contact with other components or features). Since the first shield 206 does not contact other features in the IC, the first shield 206 remains unchanged following block 107. In block 109, the processor 901 removes any non-continuous sections of the first shield 206. Since the first shield 206 has no non-continuous sections, the first shield 206 remains unchanged following block 109.

In block 111, the processor 901 determines whether the designated segment profiles determined to be in electrical communication with the first segment profile 201 for shielding are located in a different level than the first segment profile 201. In block 103, the processor 901 determined that the second segment profile 203 and the third segment profile 205 are in electrical communication with the first segment profile 201. In the illustrated example each of the segment profiles are in different vertical levels. Therefore, the processor 901 determines that the segment profiles 203 and 205 are in different vertical levels in the IC circuit.

Figure 5:
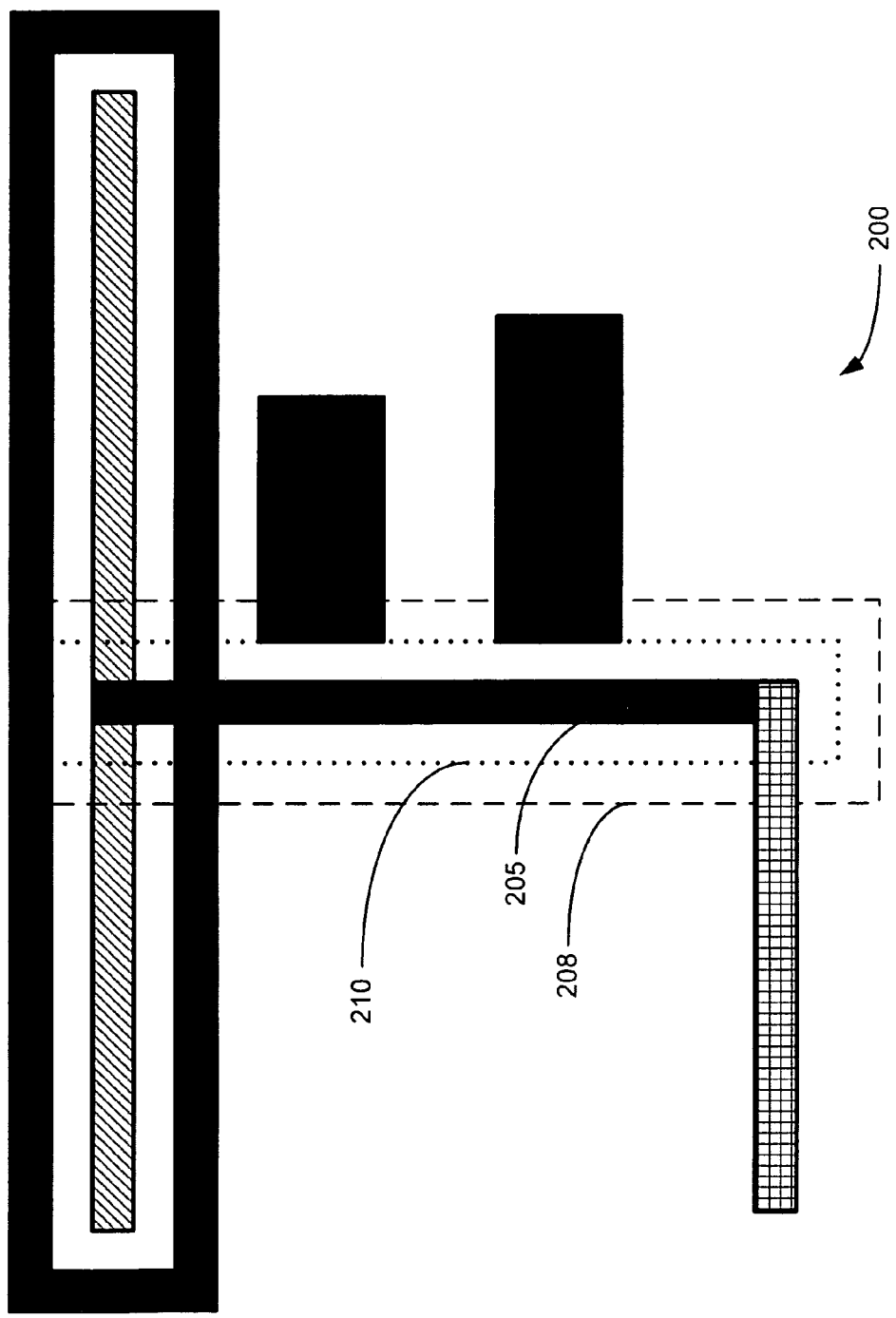
Figure 6:
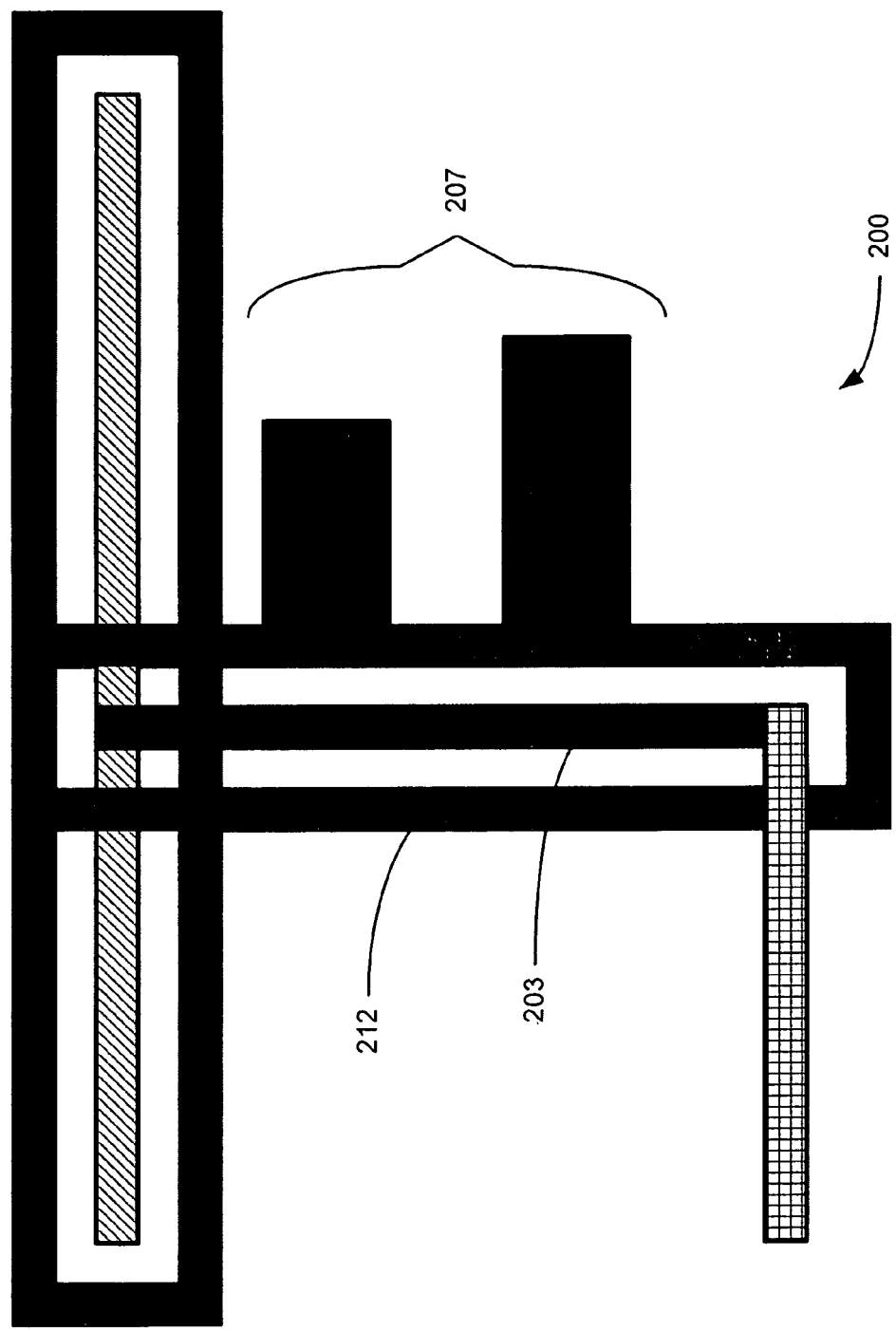

Referring now to FIG. 1b, the processor 901 receives the values that define the shielding profile for the segment profiles on the same level as the second segment profile 203 in block 113. The processor 901 receives a second net segment profile, a second offset space, and a second shield width values for a second shield. FIG. 5 illustrates a shield outer edge 208 and a second shield inner edge 210 of the second segment profile 203. FIG. 6 illustrates a second shield 212 drawn around the second segment profile 203.

Figure 7:
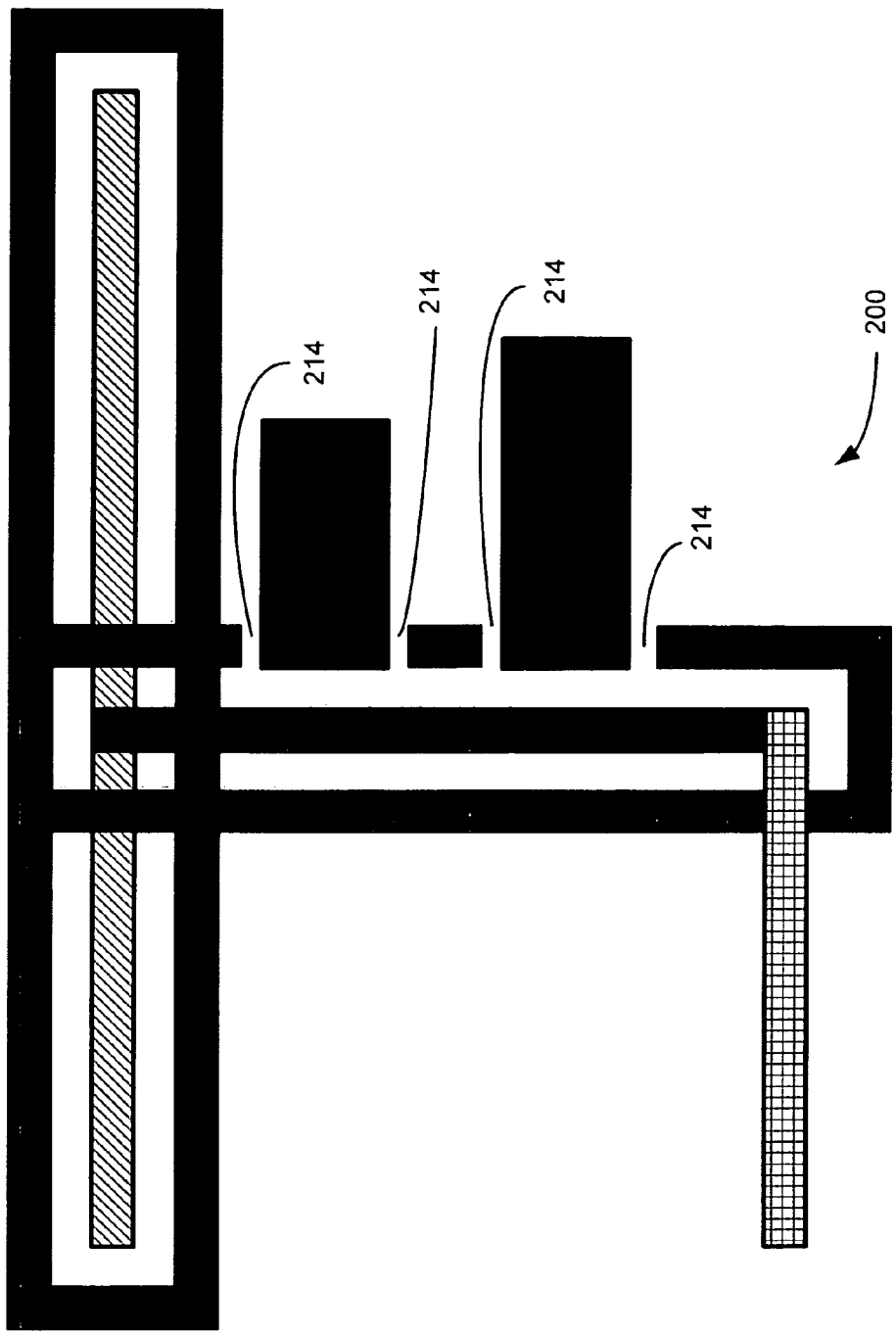

In block 115, the processor 901 removes segments of second shield 212 causing a short to other components and features of integrated circuit (i.e. in contact with other components or features). In the illustrated example of FIG. 6, the second shield 212 contacts the IC features 207. The removed sections 214 of the second shield 212 are shown in FIG. 7.

Figure 8:
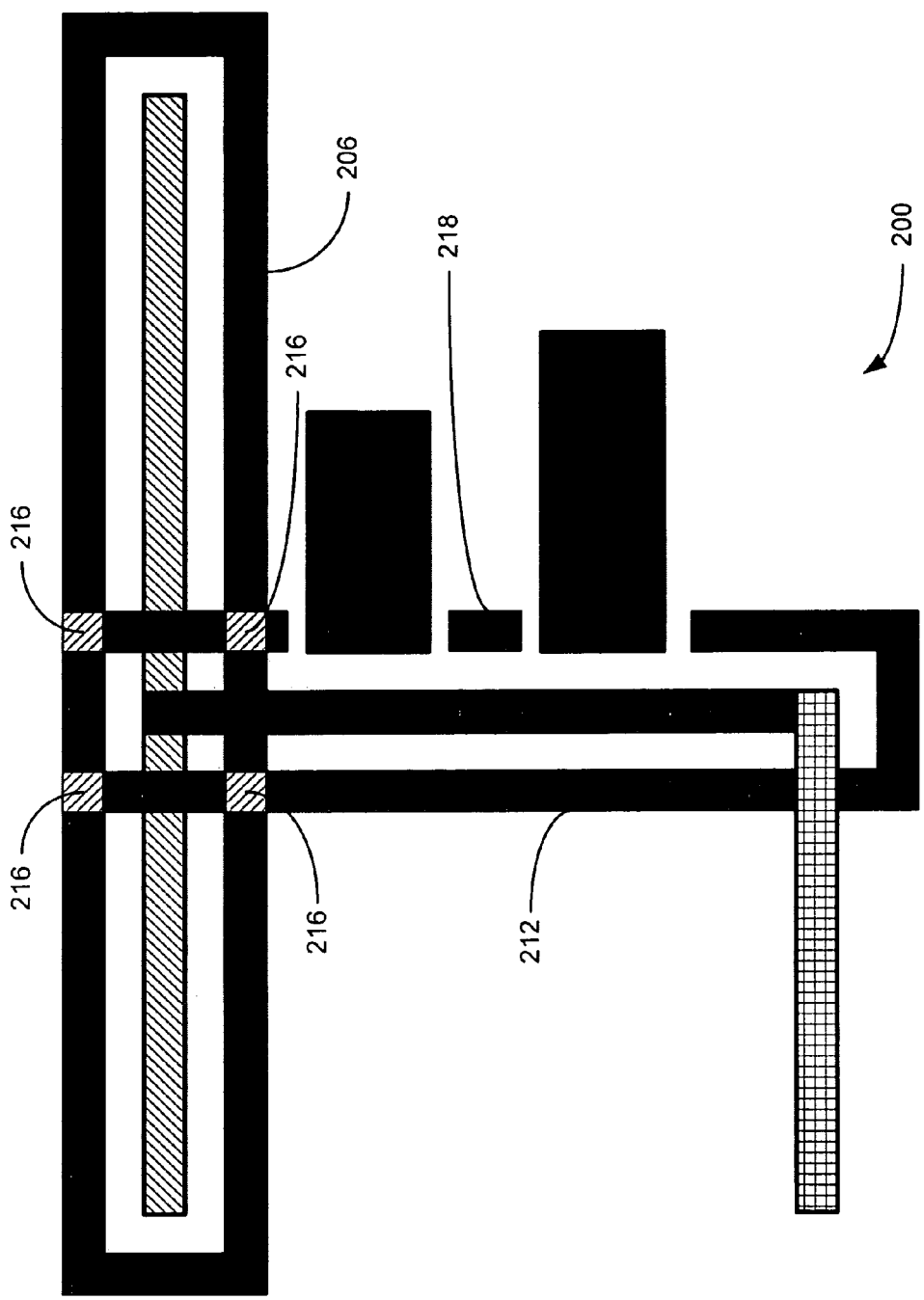
Figure 9:
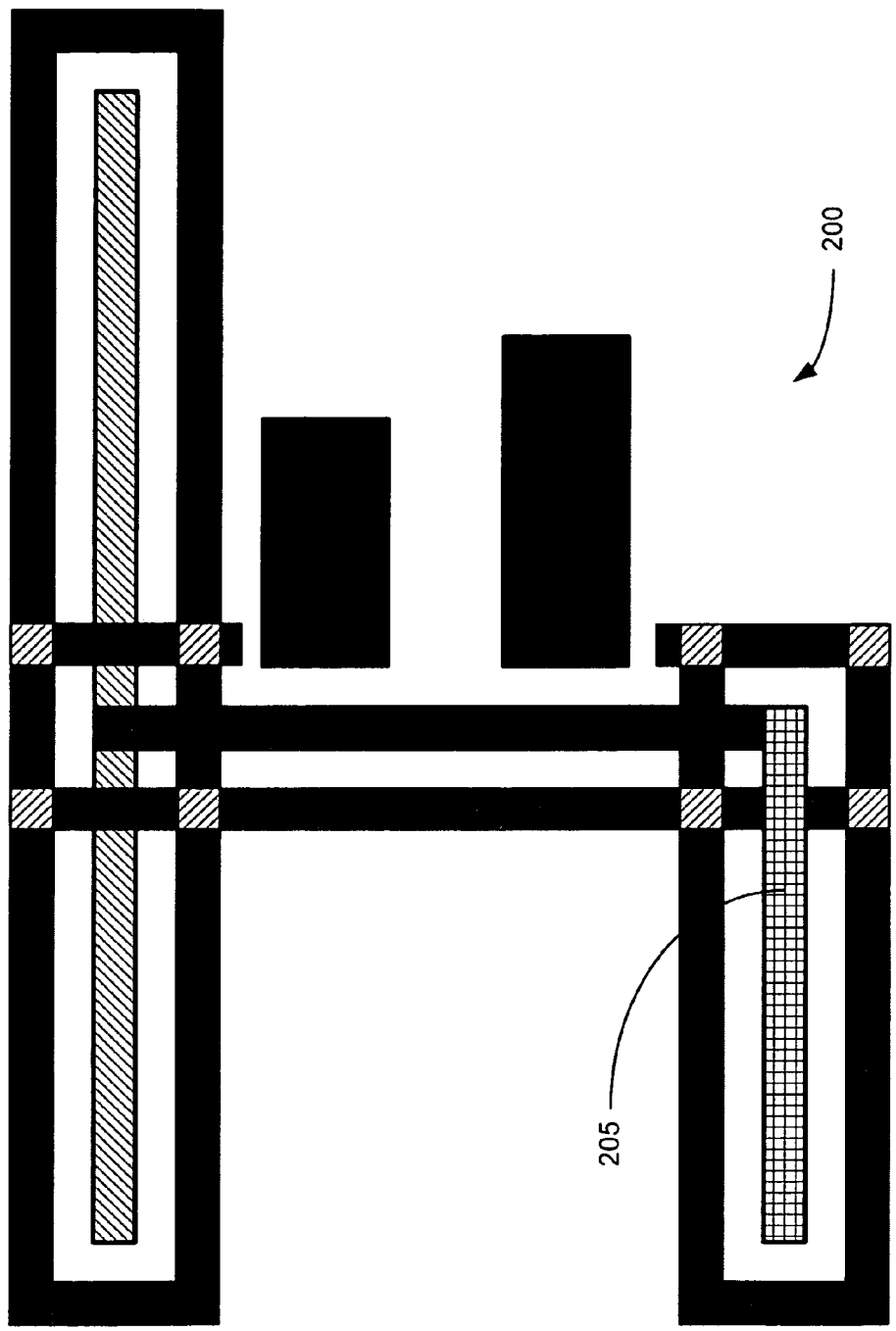

In block 117, the processor 901 inserts vias 216 illustrated in FIG. 8. The vias 216 electrically connect the first shield 206 in one level to the second shield 212 located in another level. The processor 901 determines what segments of the second shield 212 are non-continuous and removes the non-continuous segments in block 119. In FIG. 8, a non-continuous section 218 is shown. FIG. 9 illustrates the resultant structure of the IC 200 after the non-continuous section 218 is removed.

Finally, in block 121, the first shielding profile 206, the second shield 212, and the vias 216 are output to the display 903.

The illustrated method of FIGS. 1a and 1b is not limited to two net segments in two different levels, but may be applied to a plurality of net segments in a plurality of levels. Thus, the method may include similar steps regarding a plurality of segments. FIG. 9 illustrates a resultant structure after similar methods illustrated in FIGS. 1a-1b are applied to the third segment profile 205.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for designing shielding in integrated circuits, the method comprising:
   receiving a first input designating a first net segment profile on a first level in an integrated circuit for shielding;
   determining whether the designated first net segment profile is in electrical communication with other net segment profiles;
   determining whether the designated net segment profiles determined to be in electrical communication with the first net segment profile for shielding are located in a different level than the first net segment profile;
   designating net segment profiles determined to be in electrical communication with the first net segment profile for shielding;
   defining a first shielding profile corresponding to the designated net segment profiles on the first level;
   defining a second shielding profile corresponding to the designated net segment profiles on the second level;
   determining which segments of the first shielding profile and the second shielding profile contact features of the integrated circuit;
   removing segments of the first shielding profile and the second shielding profile determined to contact features in the integrated circuit;
   determining which segments of the first shielding profile and the second shielding profile are non-continuous;
   removing segments of the first shielding profile and the second shielding profile determined to be non-continuous;
   defining vias at the intersections of first shielding profile and the second shielding profile, wherein the vias are operative to connect the first shielding profile on the first level to the second shielding profile on the second level; and
   outputting the first shielding profile, the second shielding profile, and the vias to a display.

2. The method of claim 1, wherein the method further comprises:
   receiving a second input corresponding to the shielding profile on the first level including a first offset distance and a first shield width; and
   defining the first shielding profile with a first shield outer edge and a first shield inner edge, wherein the first shield outer edge equals a sum of the first net segment profile, the first offset distance, and the first shield width, and the first shield inner edge equals the sum of the first net segment profile and the first offset distance.

3. The method of claim 1, wherein the method further comprises:
   receiving a third input corresponding to the second shielding profile on the second level including a second offset distance and a second shield width; and
   defining the second shielding profile with a second shield outer edge and a second shield inner edge, wherein the second shield outer edge equals a sum of the second net segment profile, second first offset distance, and the second shield width, and the second shield inner edge equals the sum of the second net segment profile and the second offset distance.

* * * * *